US008836258B2

(12) United States Patent
Arisawa et al.

(10) Patent No.: US 8,836,258 B2
(45) Date of Patent: Sep. 16, 2014

(54) INVERTER DEVICE, MOTOR DRIVING DEVICE, REFRIGERATING AIR CONDITIONER, AND POWER GENERATION SYSTEM

(75) Inventors: Koichi Arisawa, Tokyo (JP); Hirokazu Nakabayashi, Tokyo (JP); Takuya Shimomugi, Tokyo (JP); Yosuke Shinomoto, Tokyo (JP); Mitsuharu Tabata, Tokyo (JP); Kazunori Sakanobe, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 213 days.

(21) Appl. No.: 13/264,271

(22) PCT Filed: Apr. 15, 2009

(86) PCT No.: PCT/JP2009/057589
§ 371 (c)(1),
(2), (4) Date: Dec. 15, 2011

(87) PCT Pub. No.: WO2010/119526
PCT Pub. Date: Oct. 21, 2010

(65) Prior Publication Data
US 2012/0086374 A1 Apr. 12, 2012

(51) Int. Cl.
*H02P 6/18* (2006.01)
*H02M 7/537* (2006.01)

(52) U.S. Cl.
USPC ............... 318/400.32; 318/254.1; 318/400.2; 318/400.3; 363/131; 363/132

(58) Field of Classification Search
USPC ................. 318/254.1, 400.32, 400.3, 400.2; 363/39, 89, 131, 132
See application file for complete search history.

(56) References Cited

U.S. PATENT DOCUMENTS

| 6,021,058 A | 2/2000 | Yasohara et al. |
| 6,058,037 A | 5/2000 | Shibata et al. |
| 7,706,163 B2 * | 4/2010 | Tan et al. ................... 363/132 |

(Continued)

FOREIGN PATENT DOCUMENTS

| JP | 4-351113 A | 12/1992 |
| JP | 10-327585 A | 12/1998 |

(Continued)

OTHER PUBLICATIONS

Office Action (Notice of Reasons for Rejection) dated Apr. 23, 2013, issued by the Japanese Patent Office in corresponding Japanese Patent Application No. 2011-509126, and an English translation thereof. (6 pages).

(Continued)

*Primary Examiner* — Paul Ip
(74) *Attorney, Agent, or Firm* — Buchanan Ingersoll & Rooney PC

(57) ABSTRACT

An inverter device, a motor driving device, a refrigerating air conditioner, and a power generation system, which can reduce the recovery loss thereof, are obtained. A plurality of arms that can conduct and block current are provided. At least one of the plurality of arms includes: a plurality of switching elements each having a parasitic diode and being connected in series with each other; and a reverse current diode connected in parallel with the plurality of switching elements.

14 Claims, 16 Drawing Sheets

(56) References Cited

U.S. PATENT DOCUMENTS

| | | | |
|---|---|---|---|
| 7,920,393 B2* | 4/2011 | Bendre et al. | 363/39 |
| 2002/0172063 A1* | 11/2002 | Link | 363/132 |
| 2006/0055352 A1 | 3/2006 | Mori et al. | |
| 2008/0251909 A1 | 10/2008 | Tokuyama et al. | |
| 2008/0298103 A1* | 12/2008 | Bendre et al. | 363/89 |
| 2009/0167411 A1* | 7/2009 | Machida et al. | 327/427 |

FOREIGN PATENT DOCUMENTS

| | | |
|---|---|---|
| JP | 11-69833 A | 3/1999 |
| JP | 3676737 B2 | 5/2005 |
| JP | 2006-101686 A | 4/2006 |
| JP | 2007-209166 A | 8/2007 |
| JP | 2007-288941 A | 11/2007 |
| JP | 2008-193839 A | 8/2008 |
| JP | 2008-259267 A | 10/2008 |
| JP | 2008-289232 A | 11/2008 |

OTHER PUBLICATIONS

Chinese Office Action for corresponding Chinese Appln. No. 200980158691.5 dated Aug. 5, 2013, with English translation thereof (12 pages).

Nov. 5, 2013 Japanese Office Action issued in Japanese Patent Application No. 2011-509126.

International Search Report (PCT/ISA/210) issued on May 19, 2009, by Japanese Patent Office as the International Searching Authority for International Application No. PCT/JP2009/057589.

* cited by examiner

FIG. 9

| PRINCIPAL VOLTAGE VECTOR | Wp (W-PHASE UPPER-ARM GATE SIGNAL LOGIC) | Vp (V-PHASE UPPER-ARM GATE SIGNAL LOGIC) | Up (U-PHASE UPPER-ARM GATE SIGNAL LOGIC) |
|---|---|---|---|
| $\vec{V_0}$ | 0 | 0 | 0 |
| $\vec{V_1}$ | 0 | 0 | 1 |
| $\vec{V_2}$ | 0 | 1 | 0 |
| $\vec{V_3}$ | 0 | 1 | 1 |
| $\vec{V_4}$ | 1 | 0 | 0 |
| $\vec{V_5}$ | 1 | 0 | 1 |
| $\vec{V_6}$ | 1 | 1 | 0 |
| $\vec{V_7}$ | 1 | 1 | 1 |

F I G. 1 2
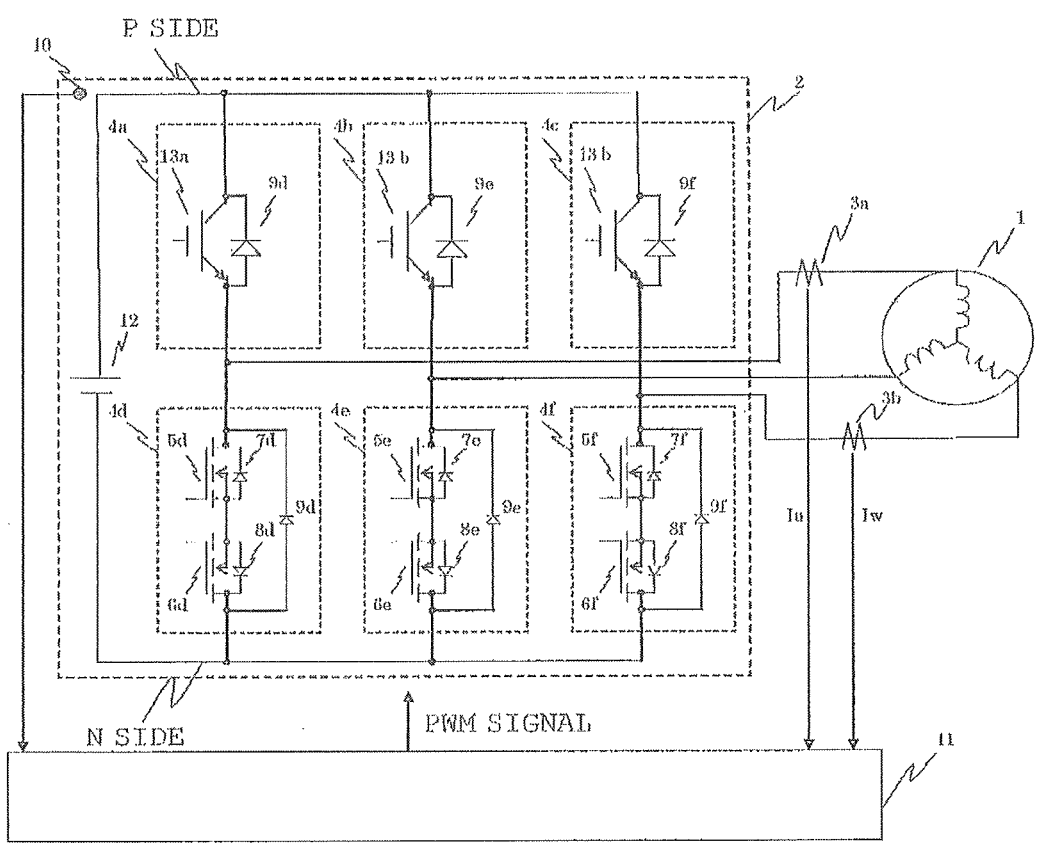

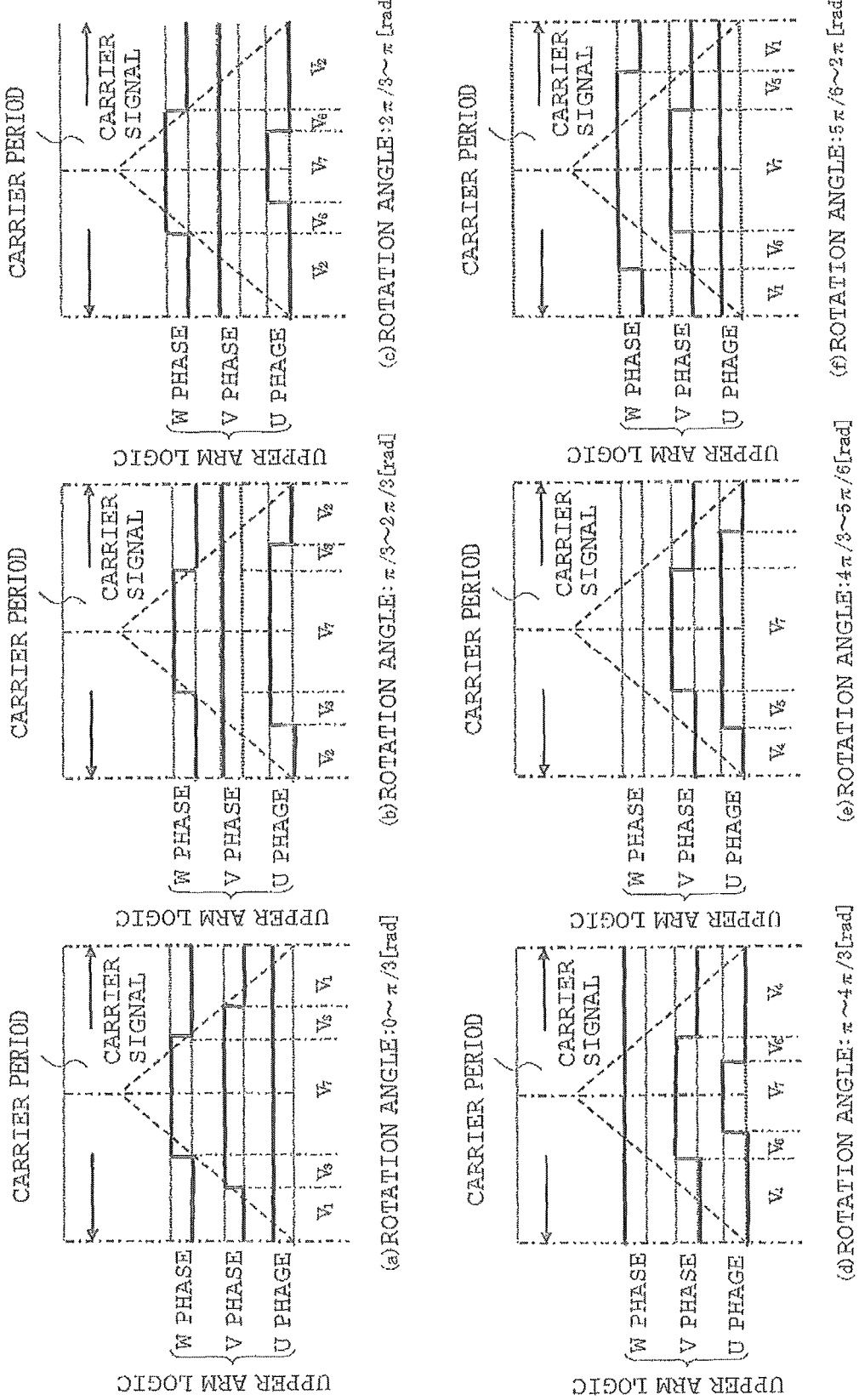

INVERTER DEVICE, MOTOR DRIVING DEVICE, REFRIGERATING AIR CONDITIONER, AND POWER GENERATION SYSTEM

TECHNICAL FIELD

The present invention relates to an inverter device, a motor driving device, a refrigerating air conditioner, and a power generation system.

BACKGROUND ART

Variable voltage/variable frequency inverters have been put to practical use and followed by the development of the application areas for various kinds of power converters. For example, a three-phase voltage inverter or the like is used as a drive circuit in a motor driving device or the like. The three-phase voltage inverter includes a three-phase bridge circuit or the like with a semiconductor power-switching device such as a thyristor, a transistor, an IGBT, or a MOSFET. In this circuit, a switching element for each phase can be realized by directly connecting its positive and negative terminals to positive and negative terminals of a direct current (DC) voltage supply, respectively. In recent years, because of increasing efficiency of the device, an improvement in such a standard circuit has been facilitated to make the device more efficient.

Under the conventional technology, for example, there is proposed "a power converter including: a pair of main circuit switching elements that is to connected in series with a DC voltage source to supply power to a load; reverse current diodes connected reversely in parallel with the respective main circuit switching elements; and a reverse voltage application circuit that applies reverse voltage smaller than the DC voltage source to the respective reverse current diodes when each of these diodes is blocked" (see, for example, Patent Document 1).

PRIOR ART DOCUMENT

Patent Document

Patent Document 1: Japanese published unexamined application No. 10-327585 (Claim 1)

DISCLOSURE OF INVENTION

Problems to be Solved by the Invention

The conventional device as described above has a problem in that the device requires an expensive, highly functional control unit for controlling the timing of reverse voltage application to deal with variation in dv/dt of a switching element, or the like. In addition, since such reverse voltage application is performed using an additional circuit, there is a problem in that a remarkable decrease in inverter efficiency occurs under fault conditions of the additional circuit.

Furthermore, the conventional inverter device has a problem in that a switching element having a parasitic diode causes recovery loss when switching.

The present invention has been made to solve the above problems. An object of the present invention is to provide an inverter device, a motor driving device, a refrigerating air conditioner, and a power generation system, which can reduce the recovery loss.

In addition, another object of the present invention is to provide an inverter device, a motor driving device, a refrigerating air conditioner, and a power generation system, that can improve their energy efficiency by comparatively simple structures.

Means for Solving the Problems

The inverter device of the present invention includes a plurality of arms that can conduct and block current. At least one of said plurality of arms includes: a plurality of switching elements each having a parasitic diode and being connected in series with each other; and a reverse current diode connected in parallel with said plurality of switching elements.

The motor driving device of the present invention is provided for driving a motor and includes the above inverter device and control means for controlling said inverter device.

The refrigerating air conditioner of the present invention includes the above motor driving device and a motor to be driven by said motor driving device.

The power generation system of the present invention includes a power generator for generating DC power and the above inverter device. Here, said inverter device is provided for converting direct current (DC) power generated by said power generator into alternating current (AC) power.

Advantages

According to the present invention, since an arm including in which a plurality of switching elements with parasitic diodes are connected in series with each other is provided, the recovery loss of the arm when switching can be reduced. In addition, the energy efficiency thereof can be improved with a comparatively simple structure.

BRIEF DESCRIPTION OF DRAWINGS

FIG. 9 is a diagram illustrating the logic state of the upper arm of a PWM inverter:

FIG. 12 is a diagram illustrating the configuration of a motor driving device according to Embodiment 3.

FIG. 13 is a diagram that illustrates an example of PWM switching patterns of the inverter circuit with overlaid two-phase modulation according to Embodiment 3.

BEST MODES FOR CARRYING OUT THE INVENTION

Embodiment 1

<Configuration of arm 4>

Figure 1:
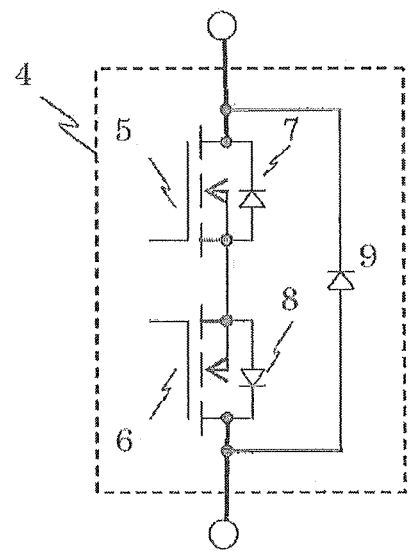
FIG. 1 is a diagram illustrating the configuration of the arm of an inverter circuit according to Embodiment 1.

FIG. 1 illustrates the configuration of an arm in an inverter circuit according to Embodiment 1.

As shown in FIG. 1, an arm 4 includes an upper switching element 5, a lower switching element 6, and a reverse current diode 9. This arm 4 is responsible for conducting and blocking current.

The upper switching element 5 includes, for example, a metal-oxide-semiconductor field-effect transistor (MOSFET) with a super junction structure (hereinafter, referred to as the "SJ structure"). The upper switching element 5 has a parasitic diode 7. Here, the details of the SJ structure will be described later.

The lower switch element 6 comprises a MOSFET. The lower switching element 6 has a parasitic diode 8.

The parasitic diode 8 of the lower switching element 6 has a shorter reverse recovery time than that of the parasitic diode 7 of the upper switching element 5.

Here, since the lower switching element 6 does not necessarily require high withstand voltage, an element with low withstand voltage may be available. For example, the lower switching element 6 may have lower withstand voltage than that of the upper switching element 5.

Incidentally, each of the upper switching element 5 and the lower switching element 6 are equivalent to the "switching elements" of the present invention.

The upper switching element 5 is in series with the lower switching element 6.

For example, an upper switching element 5 comprising an n-channel MOSFET is connected in series with a lower switching element 6 comprising a p-channel MOSFET.

Alternatively, for example, an upper switching element 5 comprising a p-channel MOSFET is connected in series with a lower switching element 6 comprising an n-channel MOSFET.

In other words, each of the upper switching element 5 and the lower switching element 6 each is connected in series with the different channel type of MOSFETs from the channel of said MOSFET.

Furthermore, for example, an upper switching element 5 comprising an n-channel MOSFET and a lower switching element 6 comprising an n-channel MOSFET may be connected reversely in series with each other and to a common source.

In other words, each of the upper switching element 5 and the lower switching element 6 is connected reversely in series with the same channel type of MOSFET as the channel of said MOSFET.

Therefore, the upper switching element 5 and the lower switching element 6 are connected in series with each other so that the polarities of their parasitic diodes 7 and 8 becomes opposite to each other.

The reverse current diode 9 is connected in parallel with the upper switching element 5 and the lower switching element 6. In addition, the reverse current diode 9 is connected so as to be the same polarity as that of the parasitic diode 7 of the upper switching element 5.

The reverse current diode 9 has a short reverse recovery time, compared with the parasitic diode 7 and the parasitic diode 8.

The reverse current diode 9 serves to let circulating current flow when both the upper switching element 5 and the lower switching element 6 are OFF.

In the present embodiment, the configuration of MOSFETs used as "switching elements" will be described but not limited thereto. Alternatively, any kind of the switching element can be used as long as it includes a parasitic diode.

Hereinafter, the present embodiment will be described with reference to an example in which the arm 4 is provided with two switching elements. According to the present invention, however, the number of switching elements is not limited to two. More than two switching elements may be mounted on the arm 4.

<Configuration of Inverter Circuit 2>

Figure 2:
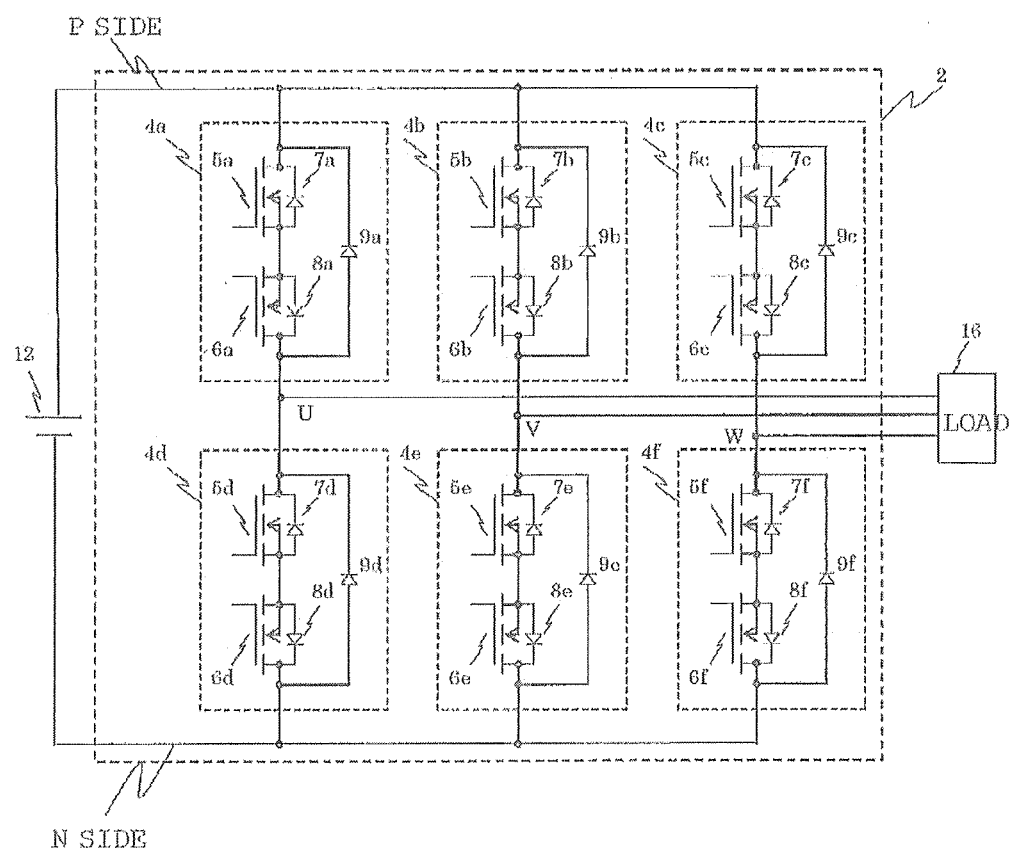
FIG. 2 is a diagram illustrating the configuration of an inverter circuit according to Embodiment 1.

FIG. 2 illustrates the configuration of an inverter circuit according to Embodiment 1.

As shown in FIG. 2, the inverter circuit 2 includes six arms 4a to 4f connected to one another through the respective bridges.

The inverter circuit 2 conducts and blocks current using the respective arms 4a to 4f, and converts DC voltage supplied from a DC voltage supply 12 into three-phase alternating current of any frequency at any voltage, to supply it to a load unit 16.

Incidentally, the inverter circuit 2 is equivalent to the "inverter device" of the present invention.

The inverter device is also referred to as a power converter.

Each of the arms 4a, 4b, and 4c has one end connected to the high voltage side (P side) of the DC voltage supply 12.

Each of the arms 4d, 4e, and 4f has another end connected to the low voltage side (N side) of the DC voltage supply 12.

Then, a node between the arm 4a and the arm 4d, a node between the arm 4b and the arm 4e, and a node between the arm 4c and the arm 4f are connected to the load unit 16.

In the following description, the arms 4a, 4b, and 4c are also referred to as "upper arms".

In the following description, the arms 4d, 4e, and 4f are also referred to as "lower arms".

The arms 4a to 4f include upper switching elements 5a to 5f, lower switching elements 6a to 6f, and reverse current diodes 9a to 9f, respectively.

The upper switching elements 5a to 5f include parasitic diodes 7a to 7f, respectively. The lower switching elements 6a to 6f include parasitic diodes 8a to 8f, respectively.

In the above description, the configuration of the arm 4 and the configuration of the inverter circuit 2 provided with the same have been described.

Next, characteristic features of a MOSFET with SJ structure used for the upper switching element 5 and also disadvantages of the conventional inverter circuit using the MOSFET with SJ structure will be described.

<MOSFET with SJ Structure>

Power devices, such as IGBTs and MOSFETs, have been used for a wide variety of applications including consumer equipment and industrial equipment. Nowadays, the development of devices using silicon carbide (SiC), gallium nitride (GaN), and so on has been carried out in various forms.

In addition, power MOSFETs with SJ structure have appeared, realizing devices with lower on-resistance (ultra-low on-resistance) than that of the conventional structure.

Figure 3:
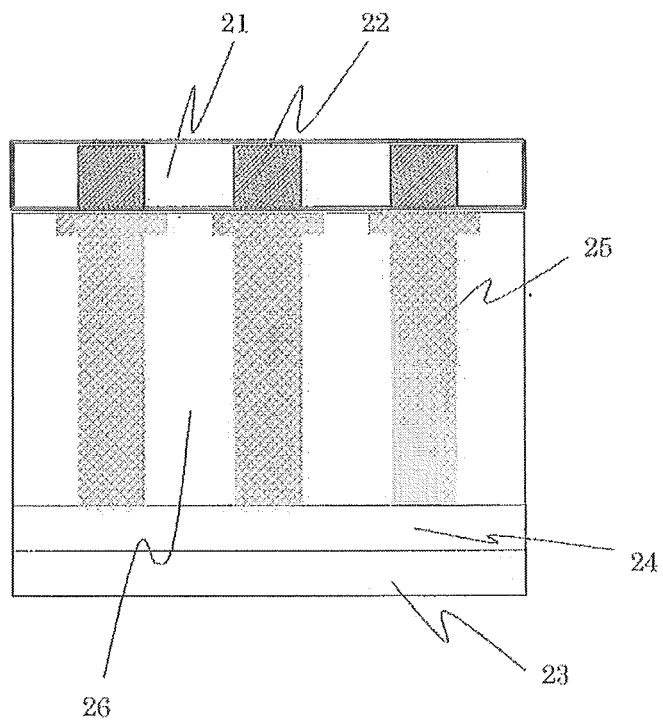
FIG. 3 is a schematic diagram illustrating the configuration of a MOSFET with a SJ structure according to Embodiment 1.

FIG. 3 is a schematic diagram illustrating the configuration of the MOSFET with SJ structure according to Embodiment 1.

As shown in FIG. 3, the MOSFET with SJ structure includes a gate 21, a source 22, a drain 23, a substrate (polarity n+) 24, a p-layer 25, and an n-layer 26.

The MOSFET with SJ structure can reduce on-resistance by keeping a charge balance between the p-layer 25 and the n-layer 26, thereby having an advantage of improving the withstand voltage of the device.

Figure 4:
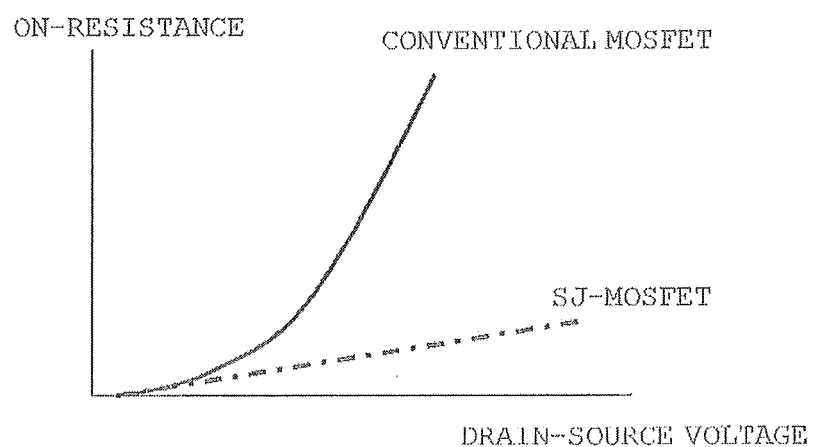
FIG. 4 is a diagram illustrating an example of the relationship between drain-source voltage and on-resistance with respect to a MOSFET with a SJ structure.

FIG. 4 is a diagram illustrating an example of the relationship between drain-source voltage and the on-resistance of the MOSFET with SJ structure.

As shown in FIG. 4, in the conventional MOSFET, the on-resistance is increased in step with an increase in drain-source voltage. In contrast, the MOSFET with SJ structure can suppress an increase in on-resistance.

In contrast, as compared with the conventional MOSFET, the characteristic feature of the MOSFET with SJ structure is a prolonged reverse recovery time of the parasitic diode, <Disadvantage of Conventional Inverter Circuit>

A disadvantage of applying the MOSFET with SJ structure having the characteristic feature as described above to an inverter circuit will be described below.

Figure 19:
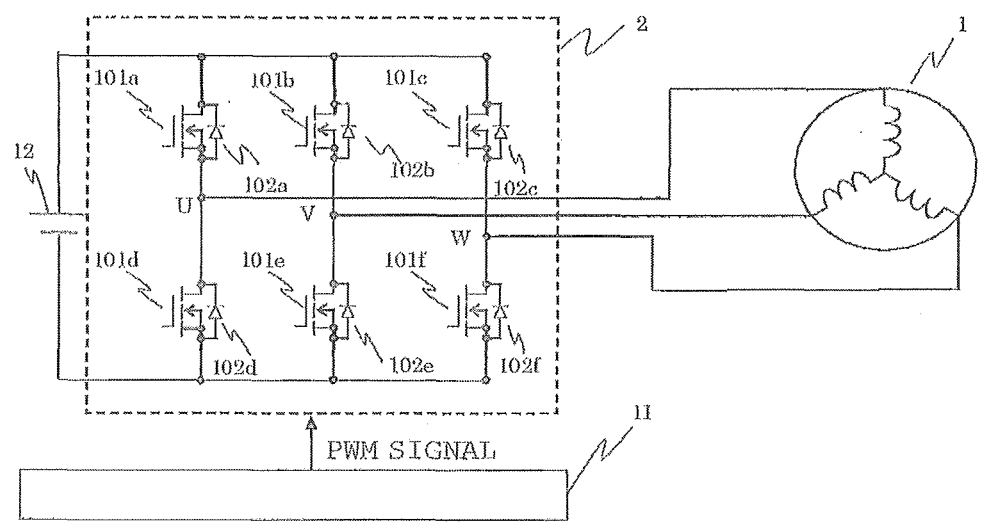
FIG. 19 is a diagram illustrating the configuration of the conventional inverter circuit.

FIG. 19 is a diagram illustrating the configuration of the conventional inverter circuit.

In the conventional inverter circuit 2, as shown in FIG. 19, the switching elements 101a to 101f comprising MOSFETs with SJ structure are connected to each other through bridges. The inverter circuit 2 performs switching control of the switching elements 101a to 101f, for example, in response to PWM signals from a control unit 11. As a result, the DC voltage from the DC voltage supply 12 is converted into three-phase alternating current of any frequency at any voltage and then is supplied to a motor 1 or the like.

Therefore, in the typical configuration of the conventional inverter circuit 2, the upper and lower arms are provided with the switching elements 101a to 101f one by one.

If the driving motor using PWM is driven by such a circuit configuration, the recovery loss of each of the parasitic diodes 102a to 102f in the respective switching elements 101a to 101f cannot be disregard.

Figure 20:
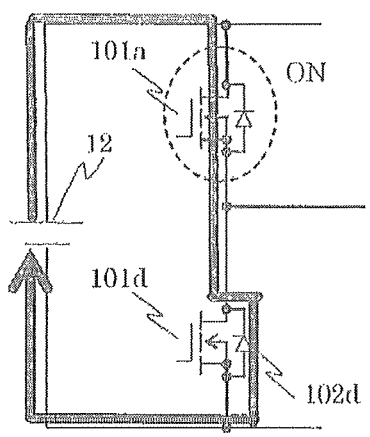
FIG. 20 is a diagram illustrating an example of the formation of an equivalent short circuit using a parasitic diode on the conventional MOSFET.

FIG. 20 is a diagram illustrating an example of the formation of an equivalent short circuit using a parasitic diode on the conventional MOSFET.

As an example, a U phase is to be focused. Now it is assumed that both the switching element 101a on the upper side of the U phase and the switching element 101d on the lower side of the U phase are OFF. It will be described that the switching element 101a on the upper side of the U phase is turned on when load current (reverse current) flows through the parasitic diode 102d on the lower side of the U phase.

In this case, accumulated carriers (charges) enables the current flow during the reverse recovery time even in the case of applying reverse bias to the parasitic diode 102d.

In other words, the parasitic diode 102d can be considered as a kind of capacitor. Thus, the circuit is in a state of allowing the current to pass therethrough until the discharge of accumulated charges is completed, that is, until the parasitic diode 102d is going off.

Therefore, as shown in FIG. 20, when the switching element 101a on the upper side of the U phase is turned on, a short circuit occurs in the DC voltage supply 12 during the reverse recovery time of the parasitic diode 102d.

In other words, during this period, the switching element 101a on the upper side of the U phase and the parasitic diode 102d on the lower side of the U phase can be equivalently considered as a short circuit.

A time period required for the formation of such an equivalent short circuit depends on the reverse recovery time of the parasitic diode 102 of the MOSFET. Thus, the longer the reverse recovery time is, the more the recovery loss is caused.

As described in this example, when using the MOSFET with SJ structure having the prolonged reverse recovery time as the switching element 101 in the conventional inverter circuit 2, the time period for the formation of the equivalent short circuit is prolonged by the presence of the parasitic diode 102, which causes an increase in recovery loss.

Figure 21:
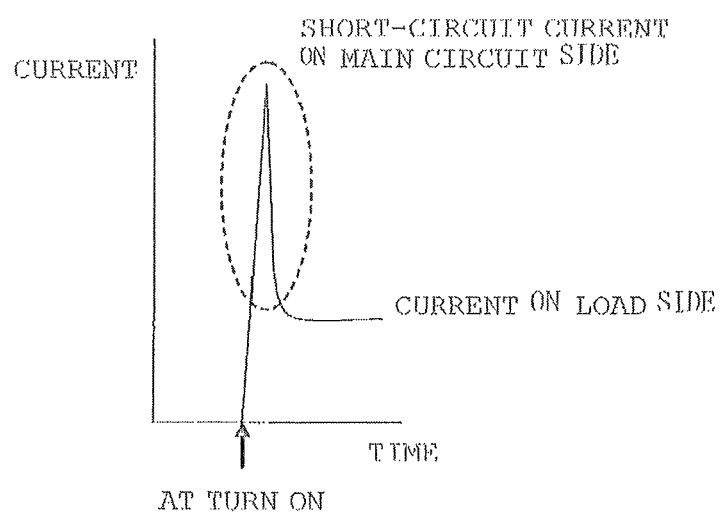
FIG. 21 is a diagram illustrating an example of a short-circuit current in the conventional inverter circuit.

FIG. 21 is a diagram illustrating an example of a short-circuit current in the conventional inverter circuit.

FIG. 21 illustrates the short-circuit current in the main circuit (on the side of the DC voltage source 12) caused by an equivalent short circuit at the time of turning on.

As shown in FIG. 21, when any switching element 101 is turned off and another switching element 101 on the opposite side is turned on, equivalent short-circuit current flows through a loop pathway with the main circuit until the discharge of charges from the parasitic diode 102 are completed, which causes an increase of loss.

<Operation of Inverter Circuit 2>

Next, the operation of the inverter circuit 2 to reduce recovery loss by preventing short-circuit current as described above will be described.

The description will be made with reference again to FIG. 2.

Gate signals with the same logic are supplied to both the upper switching element 5 and the lower switching element 6 of the respective arm 4 according to the present embodiment. In other words, the upper switching element 5 and the lower switching element 6 in the same arm 4 are controlled to ON state or OFF state at the same timing, respectively.

Here, for example, the U phase is to be focused. Now it is assumed that both the arm 4a on the upper side of the U phase and the arm 4d on the lower side of the U phase are turned OFF. In this case, load current (reverse current) flows through the reverse current diode 9d of the arm 4d on the lower side of the U phase.

At this time, the parasitic diode 8d of the lower switching element 6d is connected so that its polarity becomes opposite to that of the reverse current diode 9d. Therefore, the parasitic diode 8d blocks a conduction pathway of the load current to the upper switching element 5. Thus, the load current cannot flow through the parasitic diode 7d having a prolonged reverse recovery time.

Subsequently, when the arm 4a on the upper side of the U phase is turned on, the load current does not flow through the parasitic diode 7*d* even though a reverse bias is applied to the parasitic diode 7*d*. Then the recovery current does not flow.

As this example, in the inverter circuit 2 of the present embodiment, the upper switching element 5 does not become a conducting state when switching even if the upper switching element 5 having the parasitic diode 7 with a prolonged reverse recovery time is used.

Furthermore, the load current flows through the reverse current diode 9. Therefore, the arm 4 becomes conductive only during the reverse recovery time (the recovery time) of the reverse current diode 9.

As described above, in the arm 4 of the inverter circuit 2 of the present embodiment, the parasitic diode 7 of the upper switching element 5 and the parasitic diode 8 of the lower switching element 6 are connected in series so that their polarities become opposite to each other.

Thus, the reverse current does not flow into both the upper switching element 5 and the lower switching element 6. The flow of recovery current through the upper switching element 5 and the lower switching element 6 can be prevented when switching.

Therefore, even in the case of using the upper switching element 5 having the parasitic diode 7 with a prolonged reverse recovery time, recovery loss can be reduced.

Consequently, the efficiency of the inverter circuit 2 can be enhanced.

In addition, the parasitic diode 8 of the lower switching element 6 has a shorter reverse recovery time than that of the parasitic diode 7 of the upper switching element 5. Therefore, a conduction pathway of the reverse current to the upper switching element 5 at the time when the arm 4 performs switching is blocked, so as to shorten the time required for the formation of an equivalent short circuit, which can reduce recovery loss.

In addition, the arm 4 includes a reverse current diode 9 connected in parallel with both the upper switching element 5 and the lower switching element 6. Therefore, load current can flow into the reverse current diode 9.

In addition, the parasitic diode 9 has a shorter reverse recovery time than that of the parasitic diode 7 of the upper switching element 5. Therefore, the time required for the formation of an equivalent short circuit can be shortened when the arm 4 performs switching, which can reduce recovery loss.

In addition, an MOSFET with SJ Structure is used as the upper switch element 5. Therefore, on-resistance can be lowered and thus recovery loss can be reduced without diminishing a merit of increasing a withstand voltage.

Furthermore, when a MOSFET with low withstand voltage is used for the lower switch element 6, channel resistance is low and also a built-in potential (potential difference generated by an electric field in a depletion-layer region) is low. Therefore, an increase in on-voltage can be suppressed low and a decrease in efficiency due to an increased number of switching elements can be minimized.

In the present embodiment, the inverter circuit 2 using an MOSFET with SJ structure is shown. Alternatively, however, the inverter circuit using any switching element having a parasitic diode or a parasitic inductance may be used.

Furthermore, the reverse current diode 9 may be of a high-speed type with a short reverse recovery time to avoid the formation of a short circuit to be caused by a characteristic difference between the reverse recovery time of the upper switching element 5 and the reverse recovery time of the lower switching element 6 in the arm 4.

Furthermore, at least one of or all of arms 4 that constitute the inverter circuit 2 may be formed into a module. Such a module may be mounted on the inverter circuit 2 so as to enable to remove noise factors such as an increase in lead inductance. Furthermore, a surface area required for mounting can be reduced.

Embodiment 2

Figure 5:
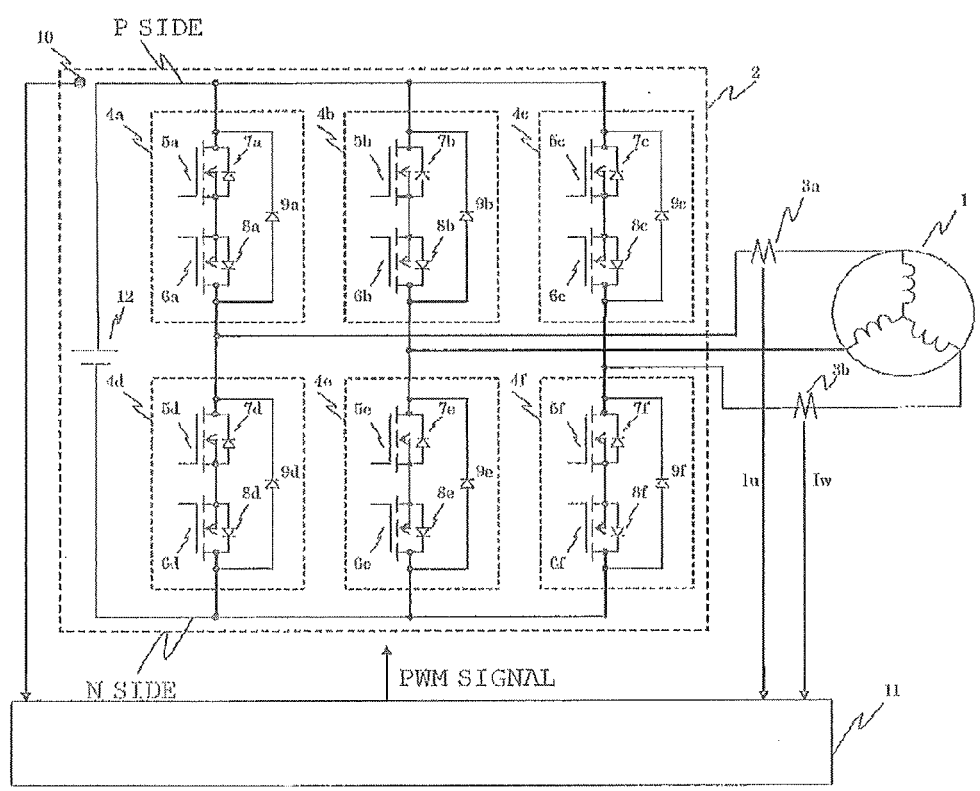
FIG. 5 is a diagram illustrating the configuration of a motor driving device according to Embodiment 2.

In this embodiment, a motor driving device equipped with the inverter circuit 2 of Embodiment 1 will be described.
<Configuration>
FIG. 5 is a diagram illustrating the configuration of a motor driving device according to Embodiment 2.

As shown in FIG. 5, the motor driving device includes an inverter circuit 2, current detecting means 3*a*, current detecting means 3*b*, voltage detective means 10, a control unit 11, and a DC voltage supply 12.

This motor driving device carries out the driving operation of a motor 1.

Here, the control unit 11 is equivalent to "control means" of the present invention.

The motor 1 comprises, for example, a three-phase synchronous motor. The motor 1 is connected to the inverter circuit 2.

The inverter circuit 2 has the same configuration as that of Embodiment 1 as described above. To the same components as those in Embodiment 1, the same reference numerals are assigned.

The current detecting means 3*a* and 3*b* detect current that flows through the coil of the motor 1 (hereinafter, referred to as "motor current"). The current detecting means 3*a* and 3*b* comprise, for example, current detecting elements, and detect voltage corresponding to the motor current. Then, the voltage obtained by the current detecting elements is inputted into the control unit 11.

The voltage detection means 10 detects DC voltage (bus voltage) supplied to the inverter circuit 2. The voltage detection means 10 comprises, for example, a voltage divider including a resistance, a capacitor, and so on, an A/D converter, an amplifier, or the like. The voltage detection means inputs the detected voltage into the control unit 11.

The control unit 11 comprises, for example, a central processing unit (CPU). The control unit 11 controls the inverter circuit 2 by pulse width modulation (PWM) to drive the motor 1. Details of the operation will be described later.

In the control unit 11, furthermore, voltage inputted from the current detecting means 3*a* and 3*b* is converted by the A/D converter or the like into numerical data that corresponds to the voltage value. The data is then converted into the data (information) of current that flows through the motor 1. Here, the detection of current is not limited such a procedure.

In the control unit 11, furthermore, voltage inputted from the current detecting means 10 is converted by the A/D converter or the like into numerical data that corresponds to the voltage value. The data is then converted into the data (information) of DC bus voltage. Here, the detection of bus voltage is not limited to such a procedure.

In the above, the configuration of the motor driving device has been described.

Next, the operation of the motor driving device of the embodiment will be described,
<Operation>
Here, the driving operation of a motor using pulse width modulation (PWM) will be described.

In the present embodiment, the description is made on the case where a motor 1 is driven and operated on the basis of the data (information) of current that flows through the coil of the motor 1, without using a magnetic pole position sensor.

In the motor driving device of the present embodiment, the control unit 11 employs the current detecting means 3a and 3b to obtain the data of motor current. In addition, the control unit 11 can obtain the data of bus voltage through the voltage detecting means 10. The control unit 11 controls the driving operation of the motor 1 by the steps of: performing calculations based on these data to generate PWM duty signals (hereinafter, referred to as PWM signals); actuating the upper switching elements 5a to 5f and the lower switching elements 6a to 6f in the respective arms 4; and applying voltage to the motor 1.

Here, the process of forming a PWM signal, which is outputted from the control unit 11 to the inverter circuit 2 based on motor currents 1u and 1w, will be described.

Figure 6:
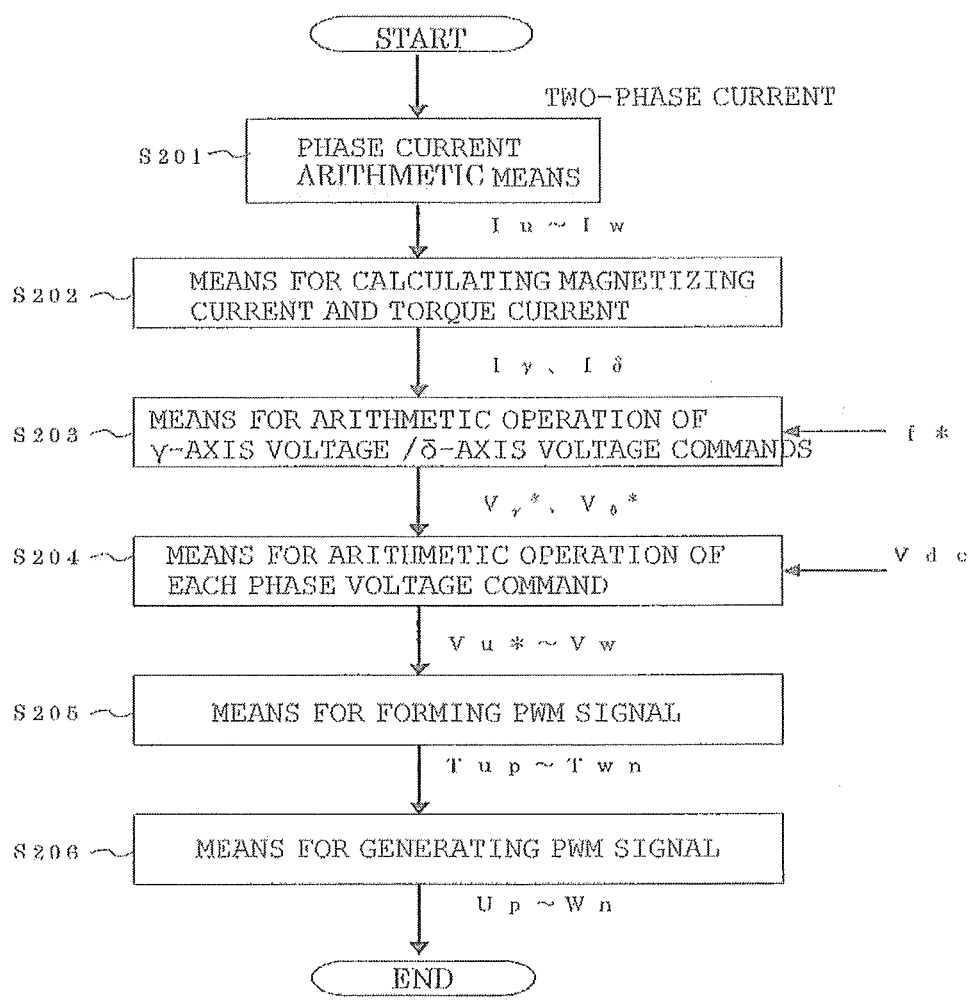
FIG. 6 is a flowchart representing a PWM creation sequence according to Embodiment 2.

FIG. 6 is a flowchart illustrating the PWM creation sequence according to Embodiment 2.

Hereafter, the operation of the motor 1 will be described with reference to the respective steps in FIG. 6.

The control unit 11, calculates currents flowing through each of U, V, and W phases from two phase currents (Iu, Iw) obtained on the basis of the detection results from the current detecting means 3a and 3b, by the use of the characteristic features of a three-phase balanced inverter such as "the total of three phase currents is set to zero".
(S202)

Next, Means for Determining Magnetizing Current and Torque Current, which is included in the control unit 11, is employed to calculate a magnetizing current component (γ-axis current) Iγ and torque current component (δ-axis current) Iδ by carrying out the coordinate conversion of each phase current value. Specifically, the magnetizing current component Iγ and the torque current component Iδ are calculated by substituting the motor currents Iu to Iw in a conversion matrix [C1] represented by the following equation (1) and carrying out the conversion. In the equation (1), however, θ represents an inverter rotation angle rotating in a clockwise direction.

[Mathematical equation 1]

$$[C_1] = \sqrt{\frac{2}{3}} \begin{bmatrix} \cos\theta & \cos\left(\theta - \frac{2}{3}\pi\right) & \cos\left(\theta + \frac{2}{3}\pi\right) \\ -\sin\theta & -\sin\left(\theta - \frac{2}{3}\pi\right) & -\sin\left(\theta - \frac{2}{3}\pi\right) \end{bmatrix} \quad (1)$$

Incidentally, in the case of using a sensor for detecting the position of a rotor, such as a pulse encoder, an electric angle frequency of the rotator is almost coincident with a rotational frequency of the inverter circuit. Thus, a coordinate system where the inverter circuit rotates at a frequency equal to the electric angle frequency of the rotator is generally referred to as a dq-coordinate system.

In contrast, when a sensor for detecting the position of a rotor, such as a pulse encoder is not used, the control unit 11 can hardly detect the dq axis coordinate with accuracy. In fact, the inverter circuit rotates with a deviation of a phase difference of Δθ with respect to the dp-coordinate system. Under such an assumption, in general, a coordinate system that rotates at the same frequency as that of the output voltage of the inverter circuit is referred to as a γδ coordinate system and distinguished from a rotational coordinate system. In the present embodiment, the exemplified case does not use any sensor. Thus, the letters γ and δ are appended in accordance with the custom.

(S203)
Next, Means for Arithmetic Operation of γ-Axis Voltage/δ-Axis Voltage commands of the control unit 11 carry out various kinds of vector controls including a velocity control using magnetizing current Iγ, torque current Iδ, and frequency command f* to obtain a subsequent γ-axis voltage command Vγ* and a subsequent δ-axis voltage command Vδ*.
(S204)

Next, Means for Arithmetic Operation of Each Phase Voltage Command of the control unit 11 employs the following equation (2), which is the inverse matrix of the equation (1), [C1]−1, to obtain each of phase voltage commands Vu* to Vv*.

[Mathematical equation 2]

$$[C_1]^{-1} = \sqrt{\frac{2}{3}} \begin{bmatrix} \cos\theta & -\sin\theta \\ \cos\left(\theta - \frac{2}{3}\pi\right) & -\sin\left(\theta - \frac{2}{3}\pi\right) \\ \cos\left(\theta + \frac{2}{3}\pi\right) & -\sin\left(\theta - \frac{2}{3}\pi\right) \end{bmatrix} \quad (2)$$

(S205)
Next, Means for Creating PWM-Signal Duty, which is Included in the Control unit 11, calculates the ON times (or OFF times) Tup to Twn of the switching element in each arm 4 based on the ratio of each of the phase voltage command voltages Vu* to Vv* of the inverter circuit 2 to the bus voltage Vdc obtained from the voltage detecting means 10 (the ratio of each phase voltage command voltage to Vdc).

In the present embodiment, as described above, though each arm 4 includes two switching elements, an upper switching element 5 and a lower switching element 6, it is assumed that these two elements in the arm 4 have the same gate signal logic. In other words, the two elements in the arm 4 are processed with the same gate signal to ensure the compatibility with the conventional model and realize the present embodiment by a simplified control method.

Incidentally, the calculation of ON times (or OFF times) Tup to Twn of the switching elements in each arm 4 is not limited to the above one. Alternatively, it may be calculated using a technique, such as the conventional space vector modulation.
(S206)

Next, PWM signal generation means included in the control unit 11 converts switching times in one carrier cycle into PWM signals and then transmits the PWM signals as PWM signals Up to Wn to the inverter circuit 2.

Figure 7:
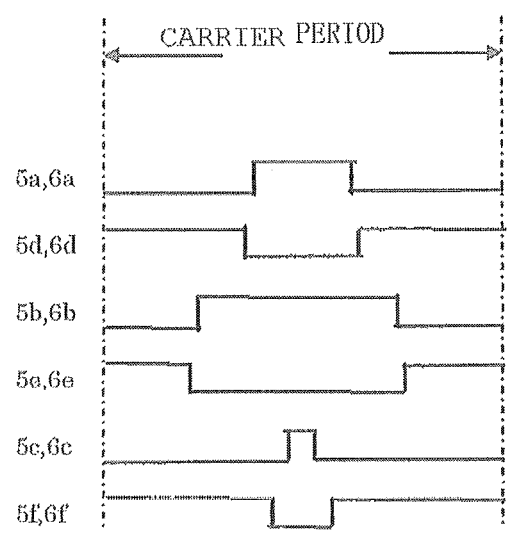
FIG. 7 is a diagram illustrating an example of a PWM-switching pattern of a motor driving device according to Embodiment 2.

The upper switching element 5 and the lower switching element 6 in each arm 4 are operated by the same gate signal on the basis of the PWM signals Up to Wn from the control unit 11 and pulse voltage corresponding to the operation is applied to the motor 1. And then the inverter circuit 2 drives and operates the motor 1. As an example, the PWM-signal logic of the switching element is shown in FIG. 7.

In the present invention, as described above, the same inverter circuit 2 as that of Embodiment 1 is provided and the motor 1 is driven by controlling the inverter circuit 2 with PWM based on motor current.

Therefore, load current (reverse current) from the motor 1 does not flow to the upper switching element 5 and the lower switching element 6, so that recovery current can be suppressed from flowing through the upper switching element 5 when switching.

Thus, recovery loss can be reduced even if the upper switching element 5 having a parasitic diode 7 with a prolonged reverse recovery time is used.

Therefore, the reduced recovery loss leads to an increase in efficiency of the inverter circuit 2, so that the energy efficiency of the motor driving device can be increased.

Embodiment 3

Figure 8:
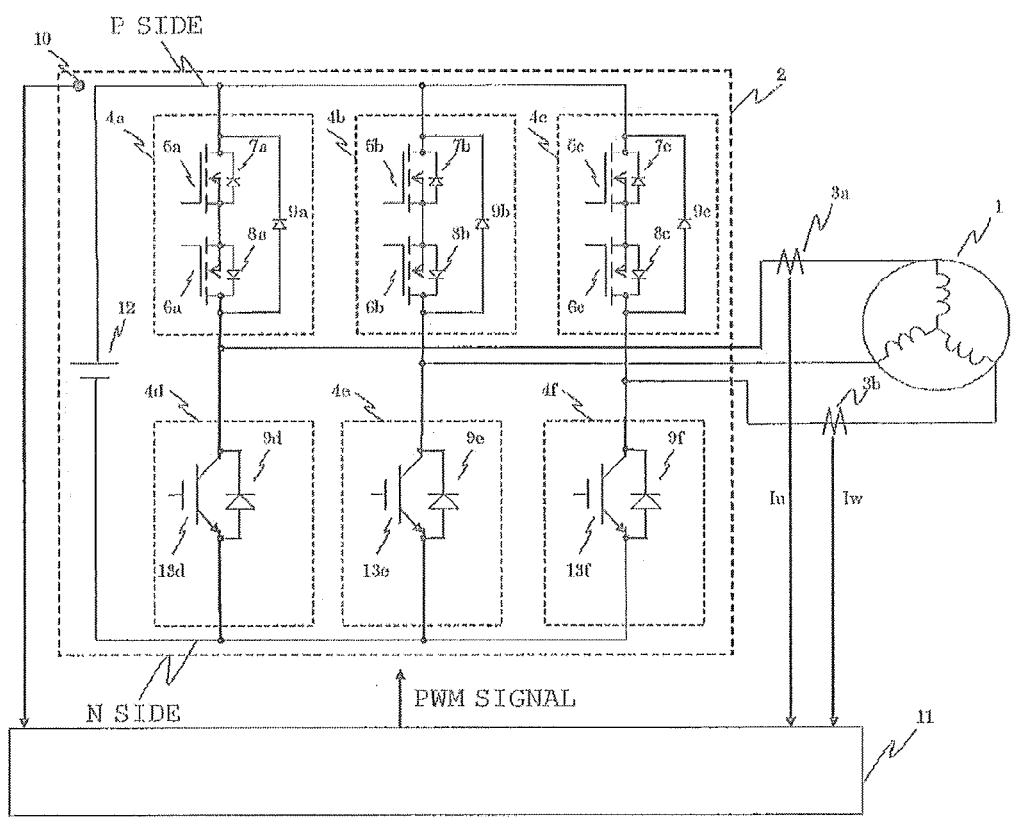
FIG. 8 is a diagram illustrating the configuration of a motor driving device according to Embodiment 3.

FIG. 8 is a diagram illustrating the configuration of a motor driving device according to Embodiment 3 of the present invention.

In the motor driving device of the present embodiment, as shown in FIG. 8, the configuration of a lower arm of an inverter circuit 2 is different from that of Embodiment 2 as described above. Other components of the present embodiment are the same as those of Embodiment 2 as described above. The same reference numerals are used to denote the corresponding or similar portions.

Lower arms (arms 4d to 4f) of the inverter circuit 2 of the present embodiment include respective single switching elements 13d to 13f and respective single reverse current diodes 9d to 9f connected in parallel with the corresponding switching elements 13d to 13f.

Incidentally, upper arms (arms 4a to 4c) of the inverter circuit 2 have the same configuration as those of Embodiment 2 as described above.

The switching elements 13d to 13f are constituted by, for example, elements such as IGBTs having low switching speed. Alternatively, the switching elements 13d to 13f may be MOSFETs in consideration of various conditions (for example, the carrier frequency, switching speed, degree of recovery loss, availability, and so on of the elements).

Here, each of these switching elements 13d to 13f of the present embodiment is equivalent to the "second switching element" of the present invention.

In addition, each of the reverse current diodes 9d to 9f of the present embodiment is equivalent to the "second reverse current diode" of the present invention.

Next, the operation of the motor driving device of the present embodiment will be described.

FIG. 9 is a diagram illustrating the logic state of the upper arm of the PWM inverter.

Figure 10:
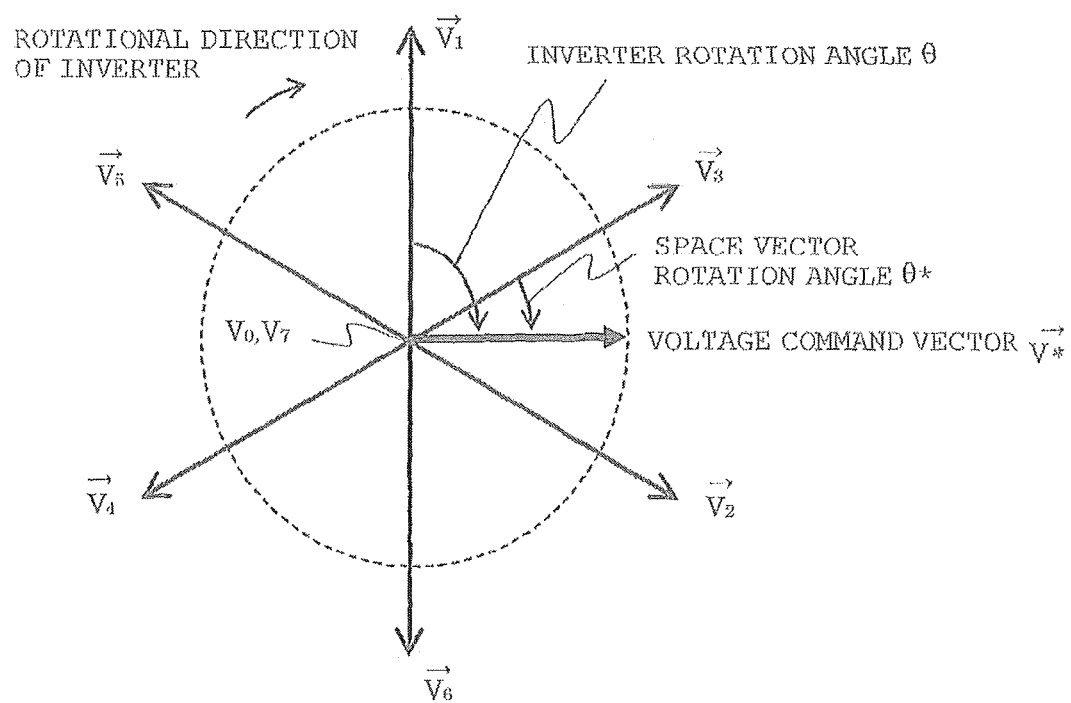
FIG. 10 is a diagram illustrating the relationship between a voltage command vector and an inverter rotation angle of a PWM inverter.

FIG. 10 is a diagram illustrating the relationship between a voltage command vector and the inverter rotation angle of the PWM inverter.

First, upper-arm logic of the inverter circuit 2 and the relationship between the voltage command vector and the inverter rotation angle of the PWM inverter will be described.

Even in this embodiment, two different switching elements in the respective arms 4a to 4c are made to have the same gate signal logic. Therefore, the logic of gate signals fed to the respective arms 4a to 4f turns on either of an upper arm connected to the positive side of a DC bus or a lower arm connected to the negative side thereof. Since this logic state is provided for each of three phases, the upper arm has eight different logic states in total (23=8). In other words, there are eight different output states (hereinafter, referred to as "voltage vectors"). Here, to represent the switching states of the respective arms 4, the ON state of the upper arm logic is defined as "1" and the OFF state thereof is defined as "0". The voltage vector of each switching mode with a certain vector length (hereinafter, referred to as a "principal voltage vector") is defined as follows.

That is, as shown in FIG. 9, when showing (W-phase upper arm logic state, V-phase upper arm logic state, U-phase upper arm logic state) of the DC bus as a representation, (0, 0, 1) is meant to vector V1, similarly (0, 1, 0) to vector V2, (0, 1, 1) to vector V3, (1, 0, 0) to vector V4, (1, 0, 1) to vector V5, and (1, 1, 0) to vector V6.

In addition, a voltage vector without any vector length (hereinafter, referred to as a "zero vector") is represented as follows: when showing (W-phase upper arm logic state, V-phase upper arm logic state, U-phase upper arm logic state) of the DC bus as a representation, (0, 0, 0) is meant to vector V0, similarly, (1, 1, 1) to vector V7.

In order to rotate the motor 1 smoothly, it is necessary to obtain a magnetic flux corresponding to a desired voltage/frequency. It can be realized by a suitable combination of the above eight different voltage vectors.

FIG. 10 illustrates the relationship between the inverter rotation angle θ and the voltage command vector V* using the direction of vector V1 (U-phase direction) as reference.

Next, the PWM control of the control unit 11 in the present embodiment will be described.

Figure 11:
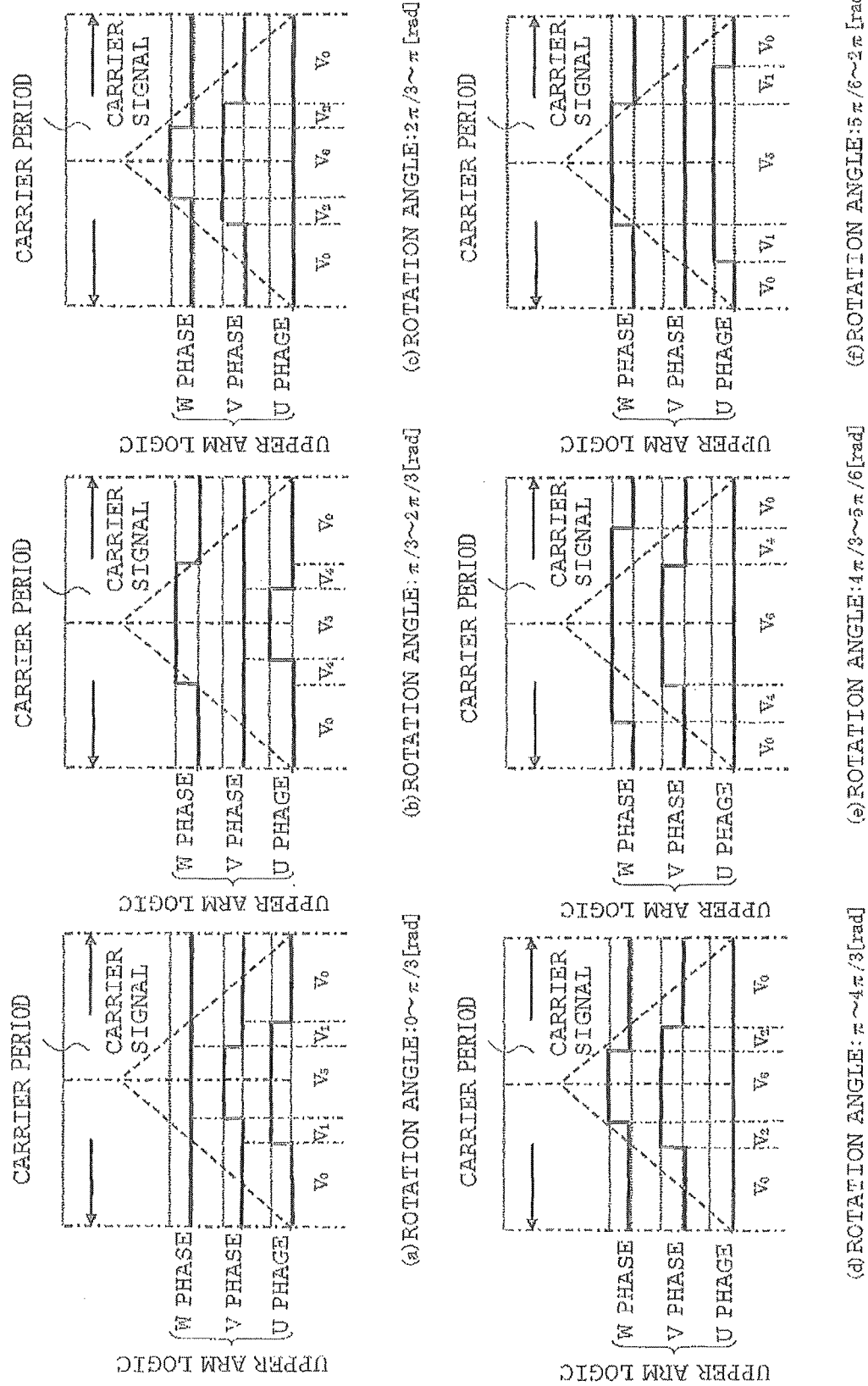
FIG. 11 is a diagram that illustrates an example of PWM switching patterns of the inverter circuit with underlaid two-phase modulation according to Embodiment 3.

FIG. 11 is a diagram that illustrates an example of PWM switching patterns of the inverter circuit with underlaid two-phase modulation according to Embodiment 3.

FIG. 11 illustrates an example of gate signal patterns of the upper arms at the time of underlaid two-phase modulation.

As shown in FIG. 11, the control unit 11 of the present embodiment carries out the underlaid two-phase modulation by the combination of the voltage vectors as described above.

By this operation, in the present embodiment, the high-efficiency can be attained by devising PWM patterns in addition to the above configuration of the inverter circuit 2, without an increase in number of the elements.

In this embodiment, as described above, the upper arm includes a combination of a plurality of MOSFETs with small conductive loss and reduces the recovery loss. In addition, the lower arm employs underlaid two-phase modulation with a small number of switching operations.

Therefore, the efficiency of the motor driving device can be enhanced.

Furthermore, the lower arm is constituted of one switching element 13, so that an increase in number of the elements can be suppressed as much as possible. Therefore, it will contribute to a reduction in cost and a reduction in environmental load on the earth.

In the above description, the lower arm is constituted of one switching element 13. Alternatively, however, the upper arm may be constituted of one switching element 13. In this case, the control unit 11 performs PWM control of the inverter circuit 2 with overlaid two-phase modulation. Hereafter, a specific example will be described.

FIG. 12 illustrates the configuration of the motor driving device according to Embodiment 3.

In the inverter circuit 2 of the motor driving device, as shown in FIG. 12, the configuration of upper arms are different from that of Embodiment 2. Other structural components of the present embodiment are the same as those of Embodiment 2 descried above. The same reference numerals are used to denote the corresponding portions.

The upper arms (arms 4a to 4c) of the inverter circuit 2 include respective single switching elements 13a to 13c and respective single reverse current diodes 9a to 9c connected in parallel with the corresponding switching elements 13a to 13c.

In addition, each of lower arms (arms 4d to 4f) of the inverter circuit 2 has the same configuration as that of Embodiment 2.

The switching elements 13a to 13c are constituted by elements such as IGBTs with low switching speed. Furthermore, MOSFETs can be used in consideration of various conditions (the carrier frequency, switching speed, degree of recovery loss, availability, and so on of the elements).

Incidentally, each of these switching elements 13a to 13c of the present embodiment is equivalent to the "second switching element" of the present invention.

In addition, each of the reverse current diodes 9a to 9c of the present embodiment is equivalent to the "second reverse current diode" of the present invention.

Next, the PWM control of the control unit 11 in the present embodiment will be described.

FIG. 13 is a diagram that illustrates an example of PWM switching patterns of the inverter circuit with overlaid two-phase modulation according to Embodiment 3.

FIG. 13 illustrates an example of gate signal patterns of the upper arm at the time of overlaid two-phase modulation.

As shown in FIG. 13, the control unit 11 of the present embodiment carries out the overlaid two-phase modulation by the combination of the voltage vectors described above.

In the present embodiment, therefore, in such an operation, the high-efficiency can be attained by devising PWM patterns in addition to the above configuration of the inverter circuit 2, without an increase in number of the elements.

As described above, the lower arm includes a combination of a plurality of MOSFETs with small conductive loss and reduces the recovery loss, while the upper arm employs overlaid two-phase modulation with a small number of switching operations.

Therefore, the efficiency of the motor driving device can be enhanced.

Thus, since the upper arm is constituted of one switching element 13, a reduction in cost and a reduction in environmental load on the earth can be expected by suppressing an increase in number of the elements as much as possible.

The present embodiment has been described the case where all the lower arms of the inverter circuit 2 include one switching element 13 or the case where all the upper arms of the inverter circuit 2 include one switching element 13. However, the present invention is not limited to this. Alternatively, at least one of the upper arms or at least one of lower arms may be constituted of one switching element. Even in such a configuration, a cost reduction can be attained by suppressing the number of the elements.

The present embodiment also employs MOSFET with SJ structure as the upper switching element 5 of the arm 4 in the inverter circuit 2. The present invention is not limited to this. Any switching element having a parasitic diode or a parasitic inductance can be used.

Even in the present embodiment, noise factors, such as an increase in lead inductance can be eliminated by collectively forming at least one of arms 4 or all of arms 4 in the inverter circuit 2 into a module and mounting it. Furthermore, a surface area required for mounting can be reduced.

Embodiment 4

Figure 14:
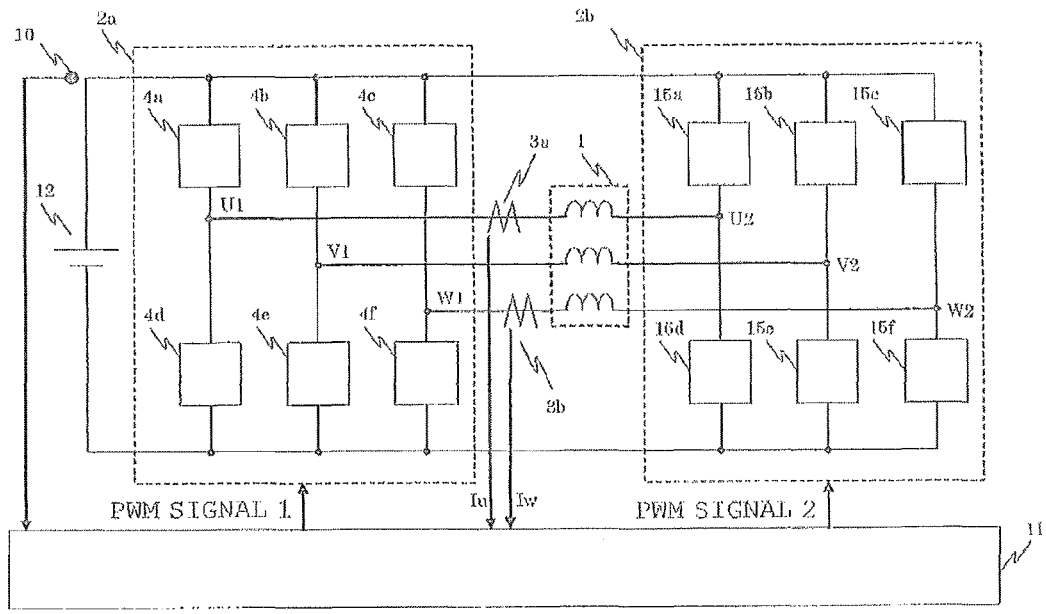
FIG. 14 is a diagram illustrating the configuration of a motor driving device according to Embodiment 4.

FIG. 14 illustrates the configuration of a motor driving device according to Embodiment 4.

As shown in FIG. 14, the motor driving device of the present embodiment includes: a DC voltage source 12; an inverter circuit 2a (master side) and an inverter circuit 2b (slave side); a motor 1; current detecting means 3a and 3b for detecting the motor current that flows through the motor 1; voltage detecting means 10; and means such as a control unit 11 for PWM control of the inverter circuits 2a and 2b to drive the motor 1.

The master inverter circuit 2a has the same configuration as that of Embodiment 1 described above.

The slave inverter circuit 2b includes arms 15a to 15f connected to one another through a bridge connection.

The arms 15a to 15f of the inverter circuit 2b include the respective single switching elements 14a to 14f and respective reverse current diodes 9a to 9f connected in parallel with the corresponding switching elements 14a to 14f.

The switching elements 14a to 14f are constituted by, for example, elements such as IGBTs having low switching speed. Alternatively, the switching elements 14a to 14f may be MOSFETs in consideration of various conditions (the carrier frequency, switching speed, degree of recovery loss, availability, and so on of the elements).

Incidentally, the inverter circuit 2b of the present embodiment is equivalent to the "second inverter device" of the present invention.

In the present embodiment, the master inverter circuit 2a is controlled by the control unit 11 with PWM to generate a PWM output in a manner as shown in Embodiment 1.

The slave inverter circuit 2b performs an operation of making an output kept at a constant P potential (hereinafter, also referred to as "laid on the P side") or an operation of making an output kept at a constant N potential (also, referred to as "laid on the N side) in response to the polarity of each phase-output voltage command voltage of the master inverter circuit 2a.

Figure 15:
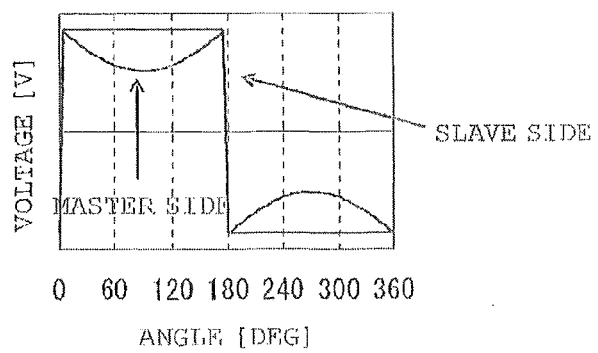
FIG. 15 is a diagram illustrating an example of a U-phase voltage command and a slave-inverter U-phase potential of a motor driving device according to Embodiment 4.

FIG. 15 is a diagram illustrating an example of a U-phase voltage command voltage and a slave-inverter U-phase potential of the motor driving device according to Embodiment 4.

In the case of the U phase, for example, when the command voltage of the master inverter circuit 2a is positive, the upper arm of the slave inverter circuit 2b is always OFF (laid on the N side), in addition, when the command voltage of the master inverter circuit 2a is negative, the upper arm of the slave inverter circuit 2b is always ON (laid on the P side).

When the command voltage of the master inverter circuit 2a is zero, the upper arm and the lower arm of the slave inverter circuit 2b are always OFF (not output). Alternatively, the upper arm of the slave inverter circuit 2b may be laid on either the P side or the N side.

In this embodiment, as described above, the slave inverter circuit 2b performs an operation of making an output kept at a constant P potential or a constant N potential, in response to the polarity of each phase-output voltage command of the master inverter circuit 2a. For this reason, the number of switching operations of the slave inverter circuit 2b can be reduced and the recovery loss in the slave inverter circuit 2b can be also reduced.

In addition, each of the arms 15 of the slave inverter circuit 2b is constituted of one switching element 14. Therefore, the number of parts in the inverter circuit 2b can be reduced and the cost thereof can be reduced.

Furthermore, this circuit configuration is applicable to a system in that one motor 1 is driven using two inverter circuits in combination or a power supply device. Thus, it can realize a system relatively simply with high versatility by extension of the conventional control.

The present embodiment also employs MOSFET with SJ structure as the upper switching element 5 of the arm 4 in the inverter circuit 2a. Alternatively, however, the present invention may be applied to a cooperative operation of a plurality of inverter circuits using any switching element having a parasitic diode or a parasitic inductance.

Even in the present embodiment, at least any one of arms 4 or all of arms 4 in the master inverter circuit 2a or arms in the slave inverter circuit 2b may be collectively formed into at least one module to be mounted. Thereby, it enables to remove noise factors, such as an increase in lead inductance. Furthermore, a surface area required for mounting can be reduced.

Embodiment 5

Figure 16:
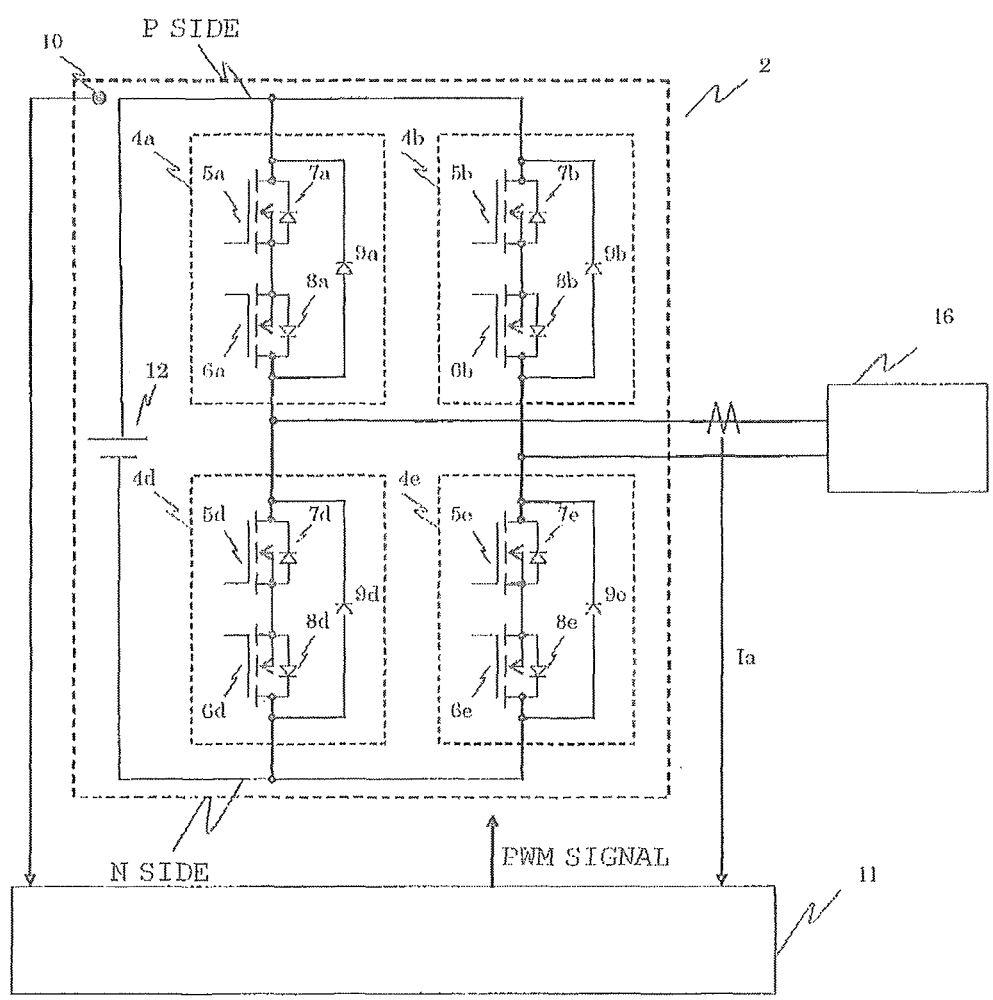
FIG. 16 is a diagram illustrating the configuration of a motor driving device according to Embodiment 5.

FIG. 16 illustrates the configuration of a motor driving device according to Embodiment 5.

As shown in FIG. 16, the motor driving device of the present embodiment includes: a DC voltage supply 12; an inverter circuit 2; a load unit 16; current detecting means 3 for detecting load current flowing through the load unit 16; voltage detecting means 10; and a control unit 11 for controlling the inverter circuit 2 with PWM to control the load unit 16.

The same numerals are given to the same configuration as those of Embodiments 1 to 4.

The inverter circuit 2 of the present embodiment includes four arms 4a to 4d that form a single-phase bridge. Each of the arms 4a to 4d has the same configuration as that of Embodiment 1 as described above.

The above configuration can obtain the effect of suppressing the recovery loss of the MOSFET in a manner similar to that of Embodiments 1 to 4 as described above, not only in a case of three-phase equipment, but also in a case where the inverter circuit 2 has a single-phase bridge structure as in the present embodiment.

Therefore, the energy efficiency can be enhanced even in the motor driving device of the present embodiment.

In the present embodiment, the present invention has been described with respect to the case where each of all the arms 4a to 4e comprises two switching elements. The present invention is not limited to this. Alternatively, at least one of arms 4 may comprise one switching element, and optionally one reverse current diode depending on the kind of the element. These components may be combined to form any circuit configuration to optimize cost effectiveness while keeping a desired efficiency.

The present embodiment also employs MOSFET with SJ structure as the upper switching element 5 of the arm 4 in the inverter circuit 2. Alternatively, however, the present invention may be applied to any switching element having a parasitic diode or a parasitic inductance.

Even in the present embodiment, at least any one of arms 4 or all of arms 4 in the inverter circuit 2 may be collectively formed into a module to be mounted. Thereby, it enables to eliminate noise factors, such as an increase in lead inductance. Furthermore, a surface area required for mounting can be reduced.

Embodiment 6

In this embodiment, as an exemplified power generating system, an example of an interconnection-type solar power generation system, in which electric power generated by solar cell modules is supplied to a linked commercial electric power system, will be described.

Figure 17:
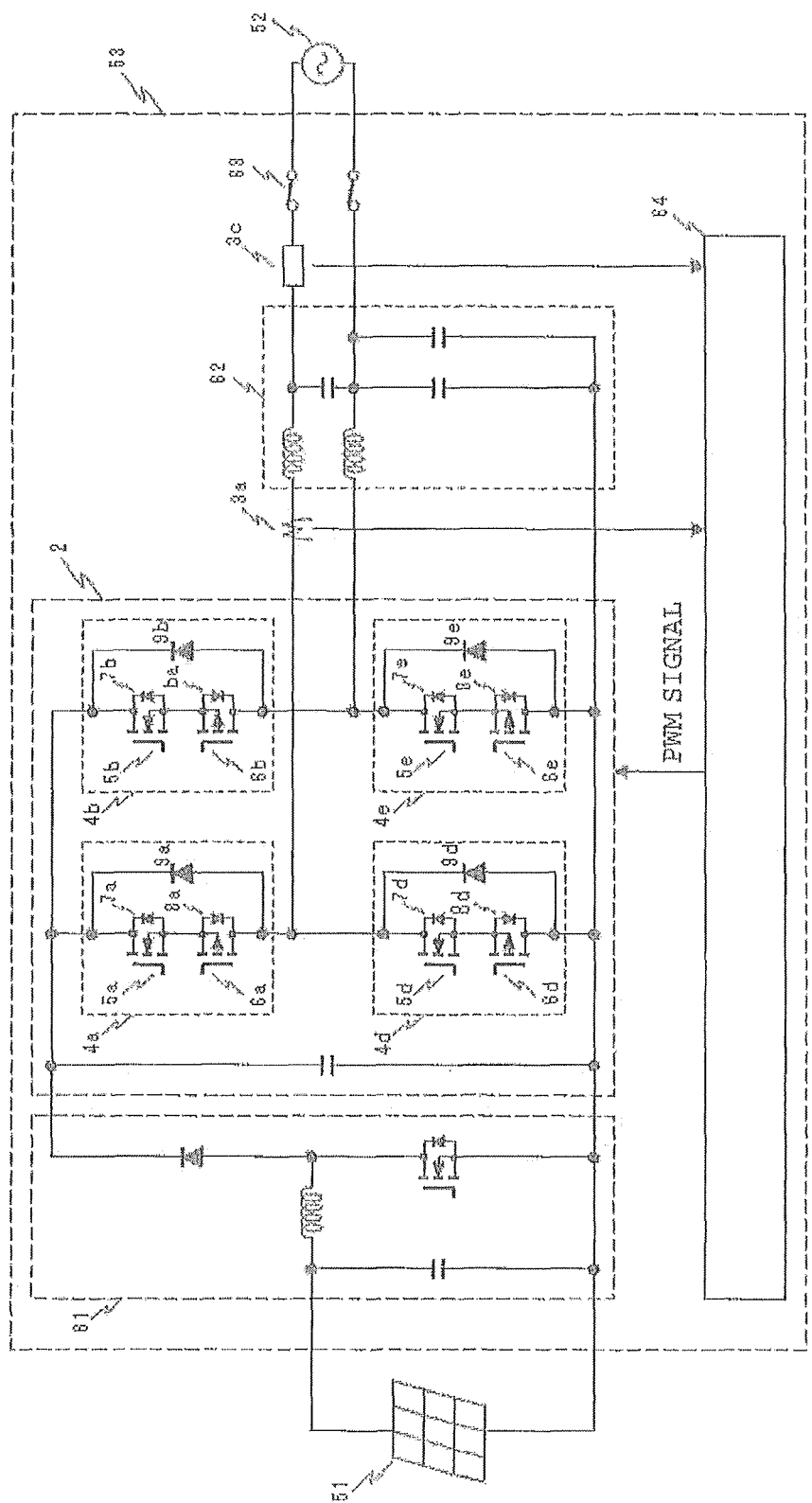
FIG. 17 is a diagram illustrating the configuration of an interconnection-type solar power generation system according to Embodiment 6.

FIG. 17 is a diagram illustrating the configuration of an interconnection-type solar power generation system according to Embodiment 6.

As shown in FIG. 17, the interconnection-type solar power generation system includes a solar cell array 51 comprising a plurality of solar cell modules and a interconnection inverter device 53 that converts DC power generated by the solar cell array 51 into AC power and jointly supplies the AC power to an interconnected single-phase commercial electric power system 52.

Incidentally, the solar cell array 51 is equivalent to the "electric power generator" of the present invention.

The interconnection inverter device 53 includes a booster circuit 61, an inverter circuit 2, a filter circuit 62, a link relay 63, current detecting means 3a, current detecting means 3c, and a processing unit 64.

The booster circuit 61 raises an input DC voltage. The inverter circuit 2 converts DC voltage into high-frequency AC voltage. The filter circuit 62 attenuates a high-frequency-switching component contained in the output voltage of the inverter circuit 2. The link relay 63 connects or disconnects the output voltage of the filter circuit 62 to the single-phase commercial electric power system 52. The current detecting means 3a detects the output current of the inverter circuit 2. The current detecting means 3c detects the output current of the filter circuit 62. The processing unit 64 outputs PWM signals for driving the inverter circuit 2 based on information from the current detecting means 3a and 3b.

The inverter circuit 2 of the present embodiment is an inverter circuit with a bridge structure like that of Embodiment 4 and includes each of arms 4a to 4d.

Each of the upper switch elements 5a to 5d in the respective arms 4 is constituted of a MOSFET with SJ structure. Furthermore, each of the lower switch elements 6a to 6d in the respective arms 4 is constituted of a MOSFET with low withstand voltage. Each of the reverse current diodes 9a to 9f is of a high-speed type with short recovery time.

In the present embodiment, the inverter circuit 2 that has the same configuration as that of Embodiment 4 described above is described. However, the present invention is not limited to this. Alternatively, the inverter circuit 2 that is described in any one of Embodiments 1 to 5 described above may be used.

In this embodiment, as described above, the solar power generation system includes the same inverter circuit 2 that is described in any one of Embodiments 1 to 5. Like Embodiments 1 to 5 as described above, the solar power generation system can reduce the recovery current of the inverter circuit 2 when switching and can be driven with high efficiency.

In the solar power generation system, furthermore, an increase in power conversion efficiency in the inverter circuit 2 leads to an increase in generated electrical quantity. Therefore, the user can obtain a larger generated electrical quantity as a result of an increase in power conversion efficiency.

In this embodiment, furthermore, since power loss during the power conversion can be reduced, there are advantages in that the generation of heat in the inverter circuit 2 can be reduced, a heat radiator can be downsized, and an improvement in reliability of components can be attained by lowering an increase in temperature, and so on.

As described above, the present invention is not only applied to any of inverter devices connected to an independent load, such as the motor 1 and the load unit 16 as in Embodiments 1 to 5 but also applied to an interconnection inverter device to be linked to a commercial electric power system as in Embodiment 6.

Incidentally, in the present embodiment, the interconnection-type solar power generation system linked to the single-phase commercial electric power system has been described. However, the present embodiment may be applied to other systems, such as an interconnection-type solar power generation system to be linked to a three-phase commercial power system and an independent-type solar power generation system that supplies electric power to an independent load without linking to another system, so as to obtain the same effect.

In the present embodiment, the solar power generation system using solar cell modules as power generation elements has been described. Alternatively, it is applicable in the same manner to a power generation system using any power generation element that generates DC power, such as a fuel cell and an aerogenerator, and the same effect can obviously be obtained.

Embodiment 7

Figure 18:
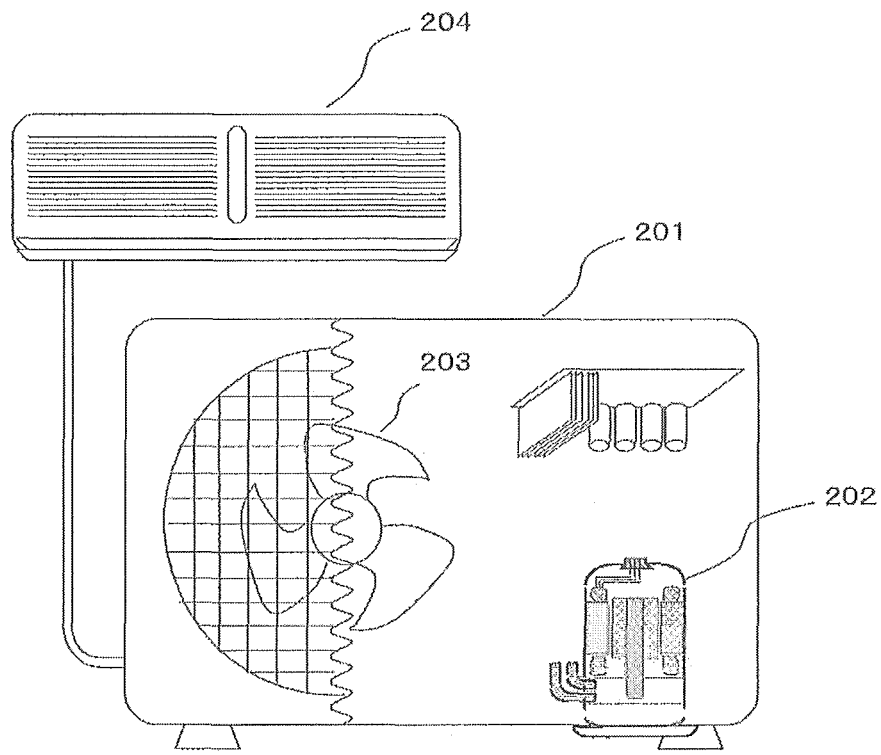
FIG. 18 is a diagram illustrating the configuration of a refrigerating air conditioner according to Embodiment 7.

FIG. 18 is a diagram illustrating the configuration of a refrigerating air conditioner according to Embodiment 7.

In FIG. 18, the refrigerating air conditioner of the present embodiment includes an outdoor unit 201 and an indoor unit 204. The outdoor unit 201 includes a refrigerant compressor 202 connected to a refrigerant circuit (not shown) to form a refrigerating cycle and a fan 203 provided for the outdoor unit to send air to a heat exchanger (not shown).

Furthermore, both the refrigerant compressor 202 and the fan 203 are rotated by the motor 1 under the controls of any of the motor driving controllers of Embodiments 2 to 5 as described above.

Even if the motor 1 is operated by such a configuration of this, the same effects as those of Embodiments 1 to 5 can be obviously obtained.

REFERENCE NUMERALS 1 motor, 2 inverter circuit, 2a inverter circuit, 2b inverter circuit, 3 current detecting means, 3a current detecting means, 3b current detecting means, 3c current detecting means, 4 arm, 4a to 4f arm, 5 upper switching element, 5a to 5f upper switching element, 6 lower switching element, 6a to 6f lower switching element, 7 parasitic diode, 7a to 7f parasitic diode, 8 parasitic diode, 8a to 8f parasitic diode, 9 reverse current diode, 9a to 9f reverse current diode, 10 voltage detection means, 11 control unit, 12 direct current (DC) voltage source, 13 switching element, 13a to 13f switching element, 14 switching element, 14a to 14f switching element, 15 arm, 15a to 15f arm, 16 load unit, 21 gate, 22 source, 23 drain, 24 substrate (polarity n+), 25 p-layer, 26 n-layer, 51 solar cell array, 52 single-phase commercial power system, 53 interconnection inverter device, 61 booster circuit, 62 filter circuit, 63 link relay, 64 processing unit, 101 switching element, 101a to 101f switching element, 102 parasitic diode, 102a to 102f parasitic diode, 201 outdoor unit, 202 refrigerant compressor, 203 fan, 204 indoor unit.

The invention claimed is:

1. A motor driving device for driving a motor, comprising:
an inverter device;
a current detector that detects electric current flowing through a coil of said motor; and
a controller that controls said inverter device, wherein
said inverter device is a three-phase inverter in which six a plurality of arms that can conduct and block current are connected to one another through a bridge connection, wherein
three arms of said six arms are connected to a high-voltage side or a low-voltage side of DC voltage supplied to said inverter device, said three arms include:
a plurality of switching elements having parasitic diodes and being connected in series with each other, and
a reverse current diode connected in parallel with said plurality of switching elements,
said switching elements are connected to each other so that polarity of a parasitic diode of one switching element is opposite to polarity of a parasitic diode of another switching element adjacent thereto,
among said plurality of switching elements, a switching element having said parasitic diode with reversed polarity relative to the polarity of said reverse current diode has a short reverse recovery time of said parasitic diode as compared with that of other switching elements,
the other three arms of said six arms include one second switching element and a second reverse current diode connected in parallel with said second switching element, and
said controller drives, based on current detected by said current detector, said motor by PWM control of said inverter device with overlaid two-phase modulation, in which a switching element of an arm connected to said high-voltage side of a phase that does not perform a switching operation among three phases is kept at an on state or with underlaid two-phase modulation, in which a switching element of an arm connected to said low-voltage side of a phase that does not perform a switching operation among three phases is kept at an on state in a period of an inverter rotation angle having a same combination of a principal voltage vector that generates a voltage command vector.

2. The motor driving device of claim 1, wherein said switching element is a MOSFET.

3. The motor driving device of claim 2, wherein said MOSFET is connected in series to another MOSFET with a different type channel from a channel of the MOSFET.

4. The motor driving device of claim 2, wherein said MOSFET is connected reversely in series to another MOSFET with the same type channel as a channel of the MOSFET.

5. The motor driving device of claim 2, wherein at least one of said plurality of MOSFETs is a MOSFET with a super junction structure.

6. The motor driving device of claim 2, wherein among said plurality of MOSFETs, a MOSFET having said parasitic diode with the same polarity as that of said reverse current diode is a MOSFET with a super junction structure.

7. The motor driving device of claim 2, wherein among said plurality of MOSFETs, a MOSFET having said parasitic diode with reversed polarity relative to that of said reverse current diode is a MOSFET with low withstand voltage as compared with other MOSFETs.

8. The motor driving device of claim 1, wherein said reverse current diode has a short recovery time as compared with that of said parasitic diode.

9. The motor driving device of claim 1, wherein said second switching element is an IGBT or a MOSFET.

10. The motor driving device of claim 1, wherein at least one of said plurality of arms is modularized.

11. The motor driving device of claim 1, comprising:
a second inverter device for driving said motor; wherein
said second inverter device has at least one arm that includes one switching element and one reverse current diode; and
said controller controls said inverter device and said second inverter device.

12. The motor driving device of claim 11, wherein said controller performs:
calculation of each phase voltage command value based on current detected by said current detector;
control of said inverter device with PWM based on said each phase voltage command value; and
control of said second inverter device based on a voltage polarity of said each phase voltage command value.

13. The motor driving device of claim 11, wherein at least one of said inverter device and said second inverter device is modularized.

14. A refrigerating air conditioner, comprising:
a motor driving device as described in claim 1; and a motor to be driven by said motor driving device.

* * * * *